US009395631B2

(12) United States Patent
Bencher (10) Patent No.: US 9,395,631 B2
(45) Date of Patent: Jul. 19, 2016

(54) MULTI-BEAM PATTERN GENERATORS EMPLOYING YAW CORRECTION WHEN WRITING UPON LARGE SUBSTRATES, AND ASSOCIATED METHODS

(71) Applicant: Applied Materials, Inc., Santa Clara, CA (US)

(72) Inventor: Christopher Bencher, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 206 days.

(21) Appl. No.: 14/242,690

(22) Filed: Apr. 1, 2014

(65) Prior Publication Data

US 2015/0277232 A1     Oct. 1, 2015

(51) Int. Cl.
*G03F 7/20*     (2006.01)

(52) U.S. Cl.
CPC ........ *G03F 7/70275* (2013.01); *G03F 7/70291* (2013.01)

(58) Field of Classification Search
CPC ............ G03F 7/70275; G03F 7/70291; G03F 7/70358
See application file for complete search history.

(56) References Cited

U.S. PATENT DOCUMENTS

| 6,204,946 | B1 | 3/2001 | Aksyuk et al. |
| 6,263,123 | B1 | 7/2001 | Bishop et al. |
| 2003/0090756 | A1 | 5/2003 | Moon et al. |
| 2006/0053406 | A1* | 3/2006 | Ivansen ............... G03F 7/70291 716/55 |
| 2006/0221320 | A1* | 10/2006 | Bleeker ............... G03F 7/70275 355/67 |
| 2008/0199104 | A1* | 8/2008 | Mushano ................ G06T 3/608 382/296 |
| 2008/0205744 | A1* | 8/2008 | Mushano ............ G03F 7/70508 382/144 |
| 2009/0011614 | A1 | 1/2009 | Bruland et al. |
| 2009/0115981 | A1* | 5/2009 | Mushano ............ G03F 7/70275 355/52 |
| 2011/0132549 | A1 | 6/2011 | Sercel et al. |
| 2011/0134407 | A1* | 6/2011 | Sung ..................... G03F 7/2057 355/67 |
| 2011/0170081 | A1* | 7/2011 | Sung ..................... G03B 27/32 355/40 |
| 2013/0130182 | A1* | 5/2013 | Markle ................ G03B 27/522 430/322 |

OTHER PUBLICATIONS

PCT/US2015/019833, The International Search Report dated Jun. 19, 2015.

* cited by examiner

*Primary Examiner* — Steven H Whitesell Gordon
(74) *Attorney, Agent, or Firm* — Patterson & Sheridan, LLP (57) ABSTRACT

Multi-beam pattern generators employing yaw correction when writing upon large substrates, and associated methods are disclosed. A multi-beam pattern generator may include a spatial light modulator (SLM) with independently controllable mirrors to reflect light onto a substrate to write a pattern. The pattern may be written in writing cycles where the substrate is moved to writing cycle zone locations. The light is reflected by the SLM onto the substrate by mirrors of the SLM in active positions to write the pattern upon the substrate. By determining a location and yaw of the substrate with respect to the SLM in each writing cycle, some mirrors of the SLM may be digitally controlled to either inactive positions or the active positions to compensate for the yaw of the substrate. In this manner, the pattern written upon the substrate may be precisely written with compensation for yaw.

18 Claims, 8 Drawing Sheets

MULTI-BEAM PATTERN GENERATORS EMPLOYING YAW CORRECTION WHEN WRITING UPON LARGE SUBSTRATES, AND ASSOCIATED METHODS

BACKGROUND

1. Field

Embodiments of the present disclosure generally relate to apparatuses and methods for lithographic patterning and more particularly for lithographic patterning for large substrates subjected to yaw and positioning errors.

2. Description of the Related Art

Large area substrates are often utilized in the manufacture of liquid crystal displays (LCDs). LCDs or flat panels are commonly used for active matrix displays such as computers, touch panel devices, personal digital assistances (PDAs), cell phones, television monitors, and the like. Generally, flat panels may comprise a layer of liquid crystal material forming pixels sandwiched between two plates. When power from the power supply is applied across the liquid crystal material, an amount of light passing through the liquid crystal material may be controlled at pixel locations enabling images to be generated.

Microlithography techniques are generally employed to create electrical features incorporated as part of the liquid crystal material layer forming the pixels. According to this technique, a light-sensitive photoresist is typically applied to at least one surface of the substrate. Then, either a photolithography mask or pattern generator exposes selected areas of the light-sensitive photoresist as part of a pattern with light to cause chemical changes to the photoresist in the selective areas to prepare these selective areas for subsequent material removal and/or material addition processes to create the electrical features. The precise placement of the electrical features upon the substrate as part of the flat panel helps determine the quality of resultant image generated by the flat panel as a uniform distribution of the pixels formed by the electrical interconnections is desirable to correctly reproduce the images viewed by users.

As the sizes of substrates continues to grow in the flat panel display industry with every subsequent generation, precise placements of patterns across larger distances of the substrates using photolithography masks has become increasingly more challenging as both the lithography masks and substrates undergo distortions during operations resulting in pattern placement errors. Also, for large substrates, small changes in yaw may cause substantial positional errors on edges of a flat panel. Also for large substrates, a mechanical precision of conventional X-Y stages which support large substrates may not be sufficient to control the patterning placement error. Therefore, new apparatuses and approaches are needed to precisely and cost effectively create patterns on large substrates.

SUMMARY

Embodiments disclosed herein include multi-beam pattern generators employing yaw correction when writing upon large substrates, and associated methods. A multi-beam pattern generator may include a spatial light modulator (SLM) with independently controllable mirrors to reflect light onto a substrate to write a pattern. The pattern may be written in writing cycles where the substrate is moved to writing cycle zone locations. The light is reflected by the SLM onto the substrate by mirrors of the SLM in active positions to write the pattern upon the substrate. By determining a location and yaw of the substrate with respect to the SLM in each writing cycle, some mirrors of the SLM may be digitally controlled to either inactive positions or the active positions to compensate for the yaw of the substrate. In this manner, the pattern written upon the substrate may be precisely written with compensation for yaw.

In one embodiment a pattern generator is disclosed. The pattern generator may include a stage configured to support a substrate and move the substrate to different writing cycle zone positions with respect to a SLM for each of a plurality of writing cycles. The pattern generator may also include a light source configured to emit light. The pattern generator may also include the SLM. Each mirror of the SLM being configured to be individually digitally controlled from an inactive position to an active position during the writing cycles to reflect a respective portion of the light to the substrate. The pattern generator may also include a computer processor configured to receive pattern data comprising an arrangement of polygons of the pattern and to identify whether the mirrors of the SLM are to be actuated to active positions during each of the writing cycles. The computer processor is configured to compensate for yaw of the substrate in each of the writing cycles by digitally controlling respective mirrors of the SLM to active or inactive positions. In this manner, precise placement of the pattern upon the substrate may be accomplished with reduced pattern placement errors related to yaw.

In another embodiment, a method of writing a pattern with a multibeam pattern generator is disclosed. The method may include writing portions of the pattern within a writing cycle zone location during writing cycles upon a substrate with optical beams of light by determining and digitally controlling respective ones of mirrors of a SLM to either an active position or an inactive position. The method may also include moving the substrate with respect to the SLM to another writing cycle zone location for each of the writing cycles. The method may also include determining yaw of the substrate for each of the writing cycles. The digitally controlling respective ones of mirrors includes compensating for the determined yaw by controlling the mirrors to either the activate or inactive positions. In this manner, the placement error of the pattern upon large substrates may be minimized.

Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

BRIEF DESCRIPTION OF THE DRAWINGS

So that the manner in which the above recited features of embodiments of the present invention can be understood in detail, a more particular description of embodiments of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for embodiments of the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Embodiments disclosed herein include multi-beam pattern generators employing yaw correction when writing upon large substrates, and associated methods. A multi-beam pattern generator may include a SLM with independently controllable mirrors to reflect light onto a substrate to write a pattern. The pattern may be written in writing cycles where the substrate is moved to writing cycle zone locations. The light is reflected by the SLM onto the substrate by mirrors of the SLM in active positions to write the pattern upon the substrate. By determining a location and yaw of the substrate with respect to the SLM in each writing cycle, some mirrors of the SLM may be digitally controlled to either inactive positions or the active positions to compensate for the yaw of the substrate. In this manner, the pattern written upon the substrate may be precisely written with compensation for yaw.

Figure 1A:
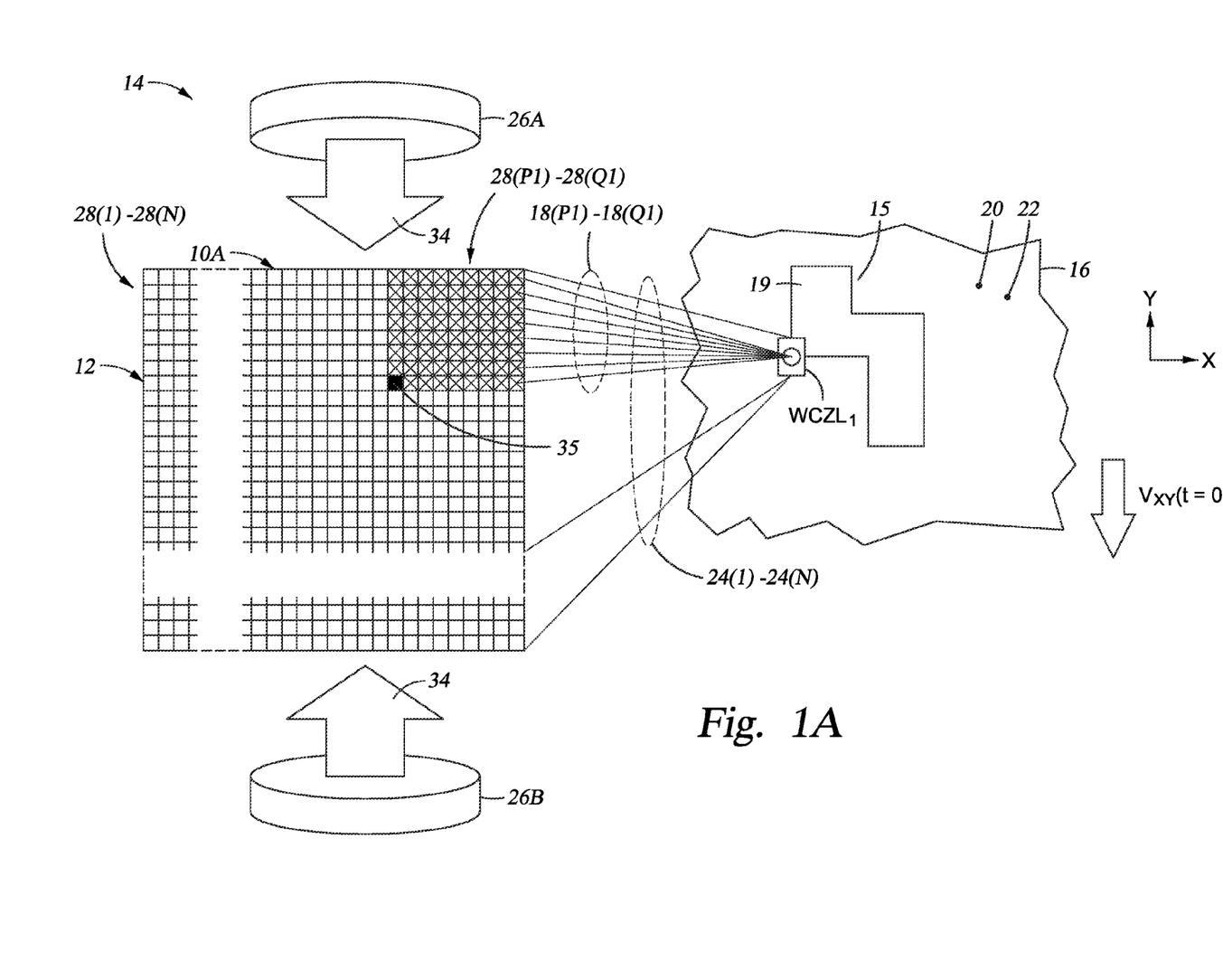
FIG. 1A is a schematic top view of a portion of a spatial light modulator (SLM) of an exemplary multi-beam pattern generator writing a corner of a polygon upon a substrate in a first writing cycle wherein actuated mirrors of the SLM writing the corner are identified.
Figure 1B:
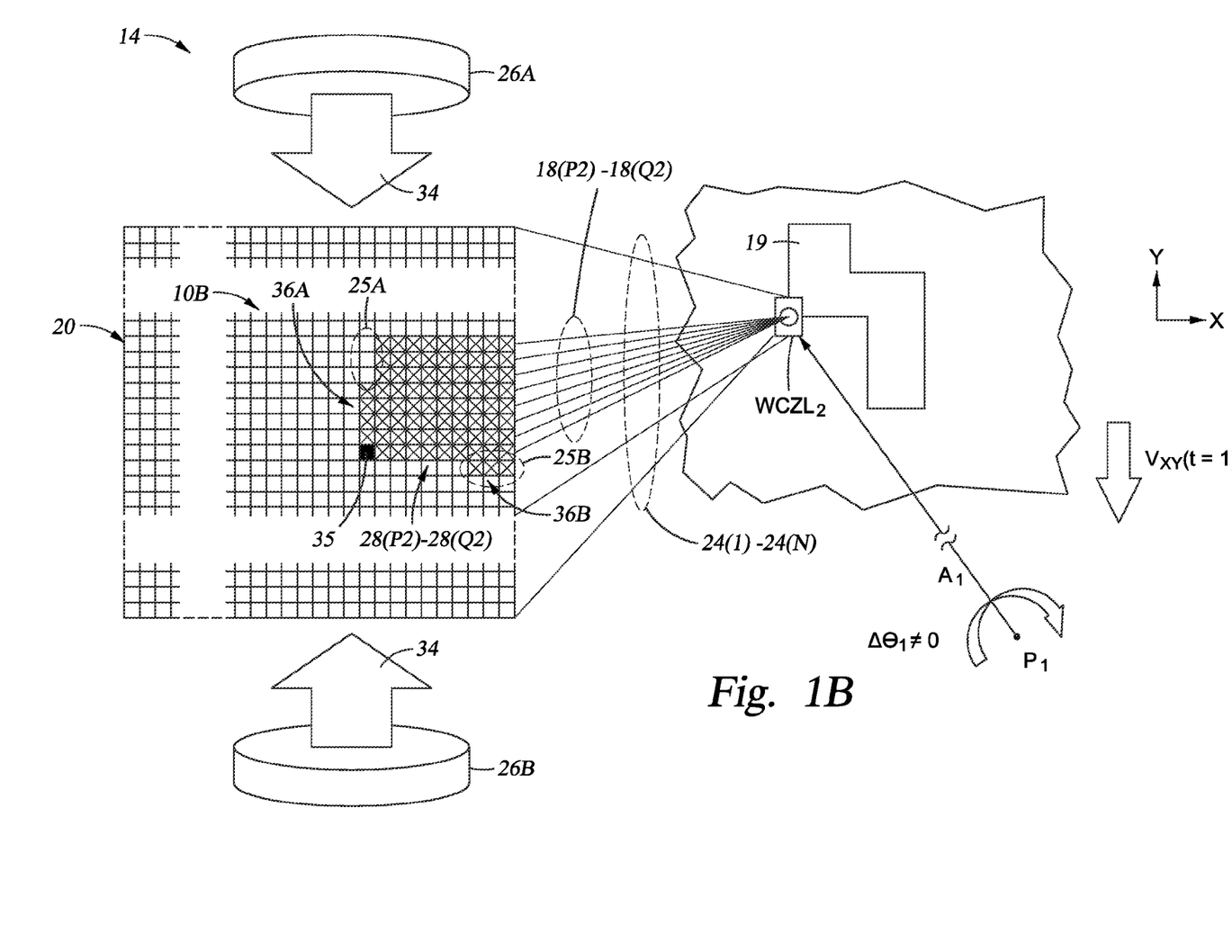
FIG. 1B is a schematic top view of another portion of the spatial light modulator (SLM) in FIG. 1A writing the corner of the polygon upon the substrate in a subsequent writing cycle wherein the substrate is subject to yaw.
Figure 1C:
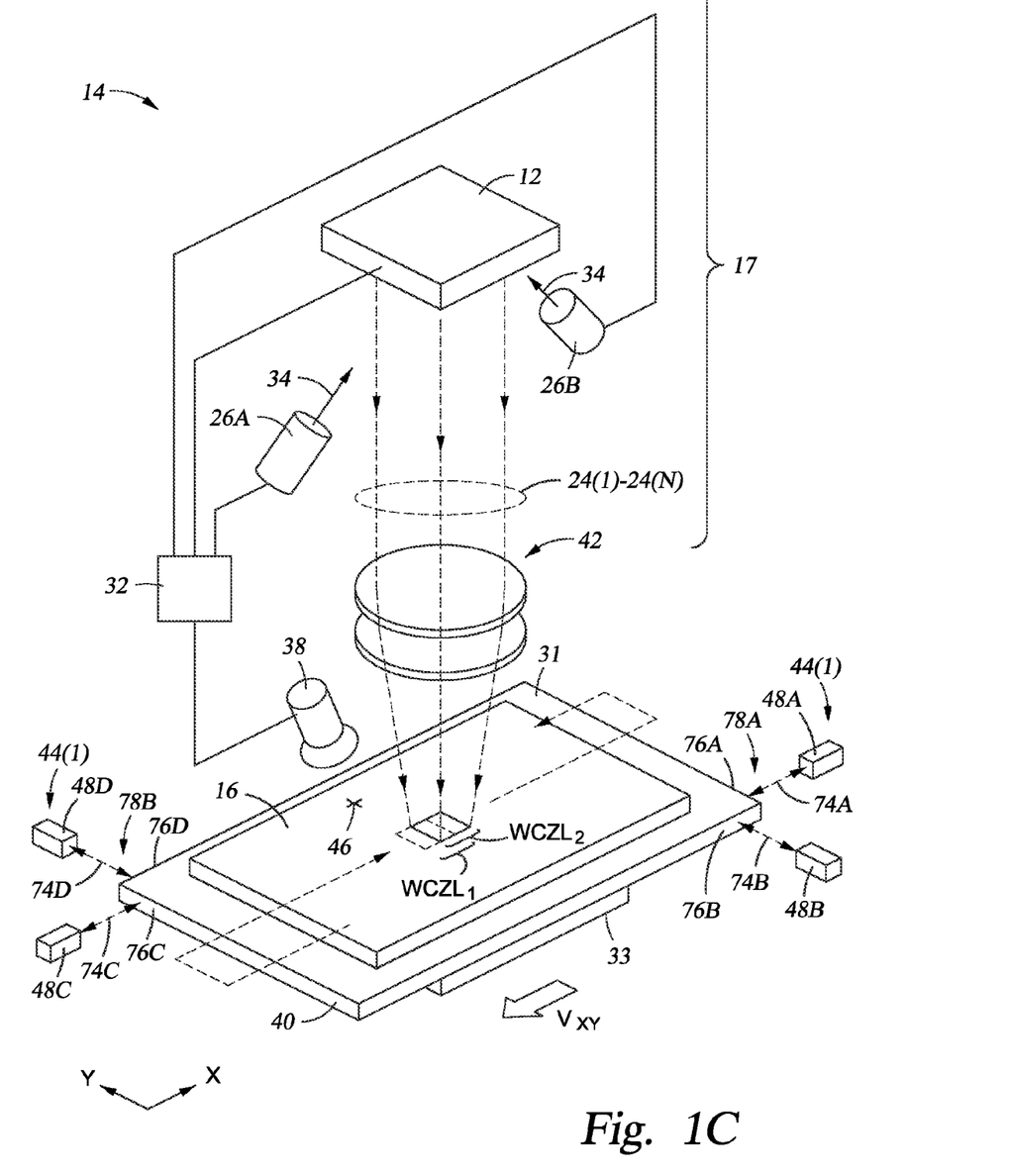
FIG. 1C is a top perspective schematic view of the multi-beam pattern generator of FIGS. 1A and 1B illustrating an exemplary configuration of laser interferometers determining positional changes of a stage supporting the substrate exhibiting the yaw of FIG. 1B.

As an introductory background before discussing features in detail, FIGS. 1A through 1C are schematic views of an exemplary pattern generator 14 writing a pattern 15 upon a substrate 16. The substrate 16 may comprise, for example, a display panel, touch panel, or continuous roll of feedstock moving through a roll-to-roll system. The pattern 15 may be written in a plurality of writing cycles WC of the pattern generator 14 which may occur at speeds of at least five (5) kilohertz. In each writing cycle WC, one or more of a plurality of optical beams 18(1)-18(N) may propagate parallel or substantially parallel along a plurality of optical pathways 24(1)-24(N) leading from a SLM 12 of the pattern generator 14 to create a respective writing cycle zone location WCZL upon the substrate 16. The SLM 12 may have at least a quantity of "N" mirrors associated with respective ones of the optical beams 18(1)-18(N). Each of the writing cycles WC may include a rest time in which the optical beams 18(1)-18(N) are not incident upon the substrate 16, and a dwell time when one or more of the optical beams 18(1)-18(N) may propagate through a respective one or more of the optical pathways 24(1)-24(N) to the writing cycle zone location WCZL. The substrate 16 may be moved a velocity $V_{XY}$ relative to the SLM 12, creating a plurality of writing cycle zone locations WCZL in which each of the optical beams 18(1)-18(N) may contribute photonic energy to the substrate 16 for each of the writing cycles WC. The writing cycle zone locations WCZL1, WCZL2, ... may partially overlap and the pattern 15 may be written as the integral sum of the photonic energy transferred by the optical beams 18(1)-18(N) to the substrate 16 during the writing cycles WC. By determining the yaw of the substrate 16 during each writing cycle WC using a configuration of laser interferometers as discussed later, the optical beams 18(1)-18(N) reflected from the SLM 12 may be turned on or off the substrate 16 in each of the writing cycles WC to compensate for the yaw. In this way, pattern placement accuracy may be improved upon the substrate 16.

It is noted that in some embodiments of the pattern generator 14, the substrate 16 may be moved at the velocity $V_{xy}$ before, during, and after the writing cycles WC. As the substrate 16 may be moved to determined X,Y positions associated with associated ones of the writing cycle zone locations WCZL, the optical beams 18(1)-18(N) may write (or "flash") the portion of the pattern 15 associated with the WCZL onto the substrate 16. The yaw of the substrate 16 may be determined as a trailing point average from many metrology measurements of the substrate 16, so the clock frequency of metrology measurements of the substrate 16 may be many times the frequency of the writing cycle WC. In this manner, the yaw may be determined and utilized as the substrate 16 may continuously move to provide efficient writing.

With this introduction, FIG. 1A is a schematic top view of a portion 10A of the SLM 12 of the multi-beam pattern generator 14 writing a corner 35 of a polygon 19 as part of the pattern 15. The polygon 19 may be within a writing cycle zone location WCZL1 upon a substrate 16 in an exemplary writing cycle WC1. At least one light source 26A, 26B may be configured to emit light 34 towards the mirrors 28(1)-28(N) of the SLM 12. The mirrors 28(1)-28(N) may be individually controlled to either reflect the light 34 as respective ones of the optical beams 18(1)-18(N) to propagate along the optical pathways 24(1)-24(N) to the substrate 16. Alternatively, the mirrors 28(1)-28(N) may be individually controlled to reflect the light 34 away from the substrate 16.

FIG. 1B is a schematic top view of another portion 10B of the SLM 12 writing the corner 35 of the polygon 19 within a subsequent writing cycle zone location WCZL2 upon the substrate 16 in an exemplary writing cycle WC2. As depicted in FIG. 1B, a yaw, which is a turning of the substrate 16 about a pivot point, has occurred between the writing cycle WC1 and the start of the writing cycle WC2. This yaw may be represented by a change of an angle theta1 ($\Delta\theta_1$) of a vector A1 to the corner 35 from a pivot point P1 which moves at velocity $V_{XY}$. If the substrate 16 were merely translated with a velocity $V_{xy}$, in the X-direction and/or y-direction, there would be no yaw, but since the yaw has occurred, yaw compensation may be provided to ensure accurate pattern placement upon the substrate 16. The yaw compensation is depicted in FIG. 1B as the on-compensation pixels 25A and the off-compensation pixels 25B which result in the jagged lines 36A, 36B, respectively, converging at the corner 35 of the pattern 15. In contrast, FIG. 1A does not include the yaw with the vector A1 and so straight lines 27A, 27B appear in FIG. 1A converging at the corner 35.

With reference to FIG. 1C, components of the pattern generator 14 and the pattern 15 written by the pattern generator 14 will now be discussed. The pattern 15 may comprise the at least one polygon 19 which may be related to circuitry of a flat panel display. The substrate 16 may include a surface 20 with a photoresist 22 applied which may be sensitive to the optical beams 18(1)-18(N). Each of the optical beams 18(1)-18(N) may serve as a writing pixel that when incident upon the substrate 16 may cause the photoresist 22 of the substrate 16 to chemically change the photoresist 22 locally at the incidence location. In this regard, this incidence location may be chemically different compared to other locations of the photoresist 22 receiving different incident photonic energy from the optical beams 18(1)-18(N). The cumulative exposure of the optical beams 18(1)-18(N) upon the photoresist 22 after all writing cycles may complete the writing of the pattern 15. Conventional microlithography techniques, also known as "processing," can then be used to further develop the pattern 15 from chemical changes to the photoresist 22 from being written by the pattern generator 14. In an alternative to microlithography "processing," "developing" may be used to further create the pattern 15 using chemical means, for example, such as a photographic film process.

Precisely controlling the optical beams 18(1)-18(N) to locations upon the photoresist 22 of the substrate 16 enables the pattern 15 to be created upon the substrate 16 with pattern placement accuracy. In this regard, the pattern generator 14 may move the substrate 16 with respect to the SLM 12 at a velocity $V_{XY}$ to bring areas of the photoresist 22 to be written within the optical pathways 24(1)-24(N) of the SLM 12 traveled by the optical beams 18(1)-18(N) when exposing the photoresist 22. The optical beams 18(1)-18(N) may be reflected on and off to the substrate 16 at the writing cycle zone location WCZL to form the pattern 15 in the photoresist 22 as the substrate 16 may be moved relative to the SLM 12 as depicted in FIG. 1C.

Figure 2:
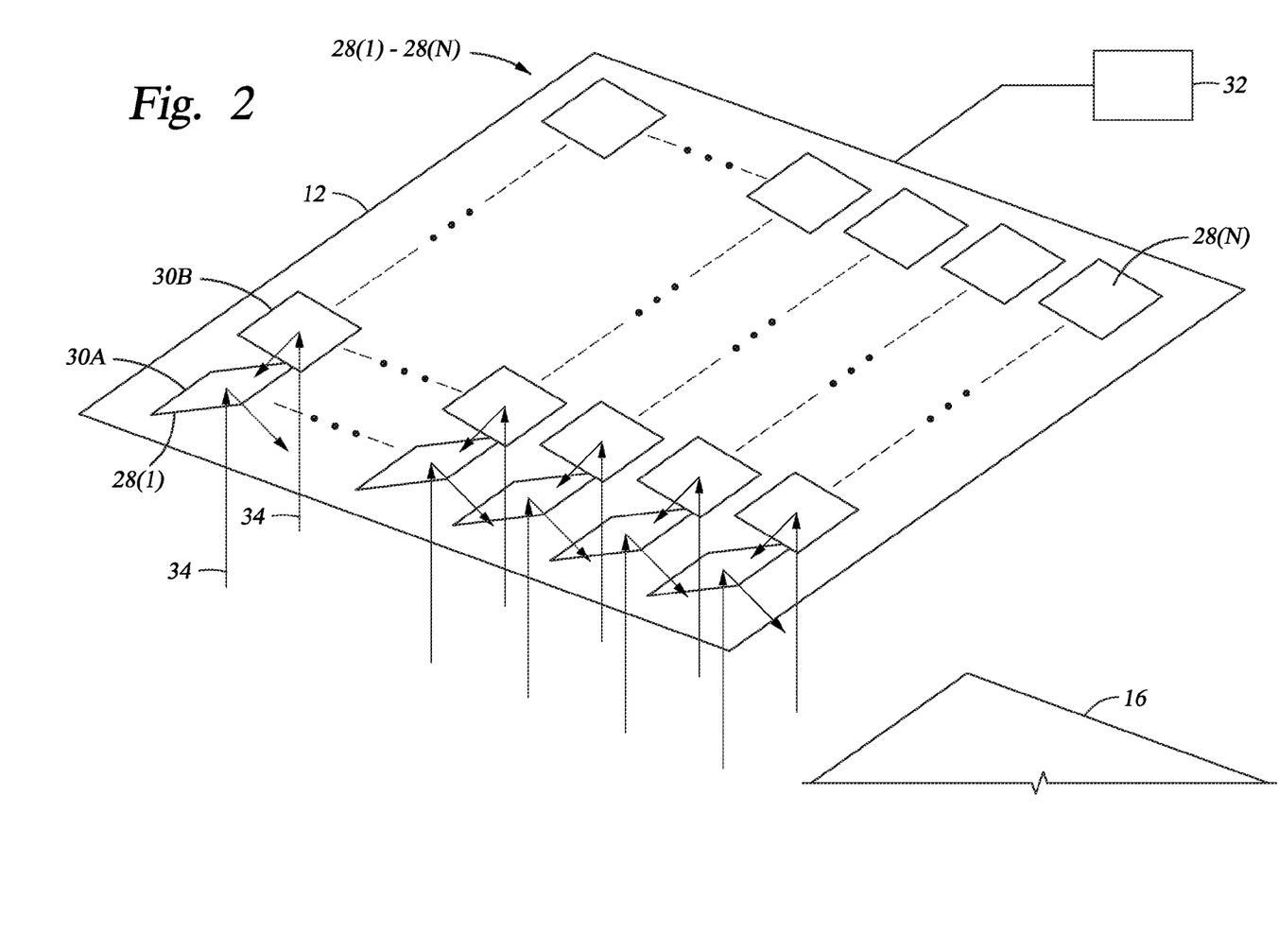
FIG. 2 is a top schematic view of the SLM of FIGS. 1A-1C illustrating active positions and inactive positions of the mirrors of the SLM.

Specifically as depicted in FIGS. 1C and 2, to reflect the optical beams 18(1)-18(N) on and off the substrate 16, the least one light source 26A, 26B may illuminate mirrors 28(1)-28(N) of the SLM 12 with the light 34. Each of the mirrors 28(1)-28(N) has an active position 30A and an inactive position 30B. When various ones of the mirrors 28(1)-28(N) are signaled by a computer processor 32 of the pattern generator 14 to be in the active position 30A, the light 34 from the light sources 26A, 26B may be reflected to the substrate 16 along the optical pathways 24(1)-24(N) associated with the various ones of the mirrors 28(1)-28(N) to turn "on" these optical pathways 24(1)-24(N). When various other ones of the mirrors 28(1)-28(N) are signaled by the computer processor 32 to be in the inactive position 30B, the light 34A, 34B from the light source 26A, 26B may be reflected away from the substrate 16 by these various other ones of the mirrors 28(1)-28(N) and thereby the local areas of the photoresist 22 at the optical pathways 24(1)-24(N) turned off would not be exposed.

With reference back to FIG. 1A, the SLM 12 may be operated in sequential writing cycles wherein the various ones of the mirrors 28(1)-28(N) may be actuated to the active position 30A (FIG. 2) for a specified time period (or dwell period) during the writing cycle WC before returning to the inactive position 30B (FIG. 2) for the remainder of the writing cycle WC. During each of the writing cycles WC, a corresponding writing cycle zone location WCZL representing a portion of the pattern 15 associated with one of the writing cycles WC may be written (or "flashed") by the optical beams 18(1)-18(N). The writing cycle WC may be at least five (5) kilohertz. The substrate 16 may be moved at the velocity $V_{XY}$ before, during, and after the writing cycles WC. At the beginning of each writing cycle WC the computer processor 32 may determine the precise desired location of the at least one polygon 19 of the pattern 15 upon the substrate 16 and any of the optical pathways 24(1)-24(N) that my fall within the at least one polygon 19. If any of the optical pathways 24(1)-24(N) fall within the at least one polygon of the pattern 15, then the associated ones of the mirrors 28(P1)-28(Q1) may be actuated to the active position 30A to reflect the respective ones of the optical beams 18(P1)-18(Q1) into these ones of the optical pathways 24(P1)-24(Q1) to expose the at least one polygon 19 of the pattern 15. The desired locations of each of the polygons 19 may be determined by taking into account the yaw of the substrate 16 as discussed below. In this manner, the pattern 15 may be written with improved pattern placement accuracy.

With reference back to FIG. 1B, when the substrate 16 is moved relative to the SLM 12 to begin a subsequent write cycle, the computer processor 32 may determine that a yaw has occurred. The yaw may relocate a corner 35 of the polygon 19 from a position expected merely given the velocity Vxy of the substrate 16 supported by the stage 40. The computer processor 32 may update the position of polygon 19 of the pattern 15 relative to the SLM 12 and turns on respective optical pathways 24(P2)-24(Q2) corresponding to the yaw of the polygon 19. The adjustment for yaw is represented by the jagged lines 36A, 36B in FIG. 1B converging to form the corner 35 of the polygon 19. The adjustment for yaw can be done "on the fly" for each writing cycle by the computer processor 32 as the position of the pattern 15 upon the substrate 16 may be determined relative to the optical pathways 24(1)-24(N) of the mirrors 28(1)-28(N) of the SLM 12.

FIG. 1C is a top perspective view of the multi-beam pattern generator 14 comprising the SLM 12, the light sources 26A, 26B, an alignment camera 38, a stage 40, optics 42, yaw detection apparatus 44, and the computer processor 32. Details of each of these components of the multi-beam pattern generator 14 are now discussed in sequence.

The SLM 12 as introduced briefly above comprises the mirrors 24(1)-24(N) which are individually controlled by signals from the computer processor 32. The SLM 12 may be, for example, a DLP9500-type digital mirror device made by Texas Instruments Incorporated of Dallas, Tex. The SLM 12 may have the plurality of mirrors 28(1)-28(N), for example, arranged in 1920 columns and 1080 rows. Each of the mirrors 28(1)-28(N) of the SLM 12 may be configured to be individually actuate-able (or digitally controlled) from an inactive position 30B to an active position 30A to reflect a respective portion of the light 34 to the substrate 16. Each of the mirrors 28(1)-28(N) may reflect a portion of the light 34 to the substrate 16 while in the active position 30A and less than one (1) percent of this amount to the substrate 16 when in the inactive position. The photonic energy of the light 34 may be deposited across the pattern 15 and may at least overlap between writing cycle positions WCZL1, WCZL2. In this manner, features of the pattern 15 may be determined from multiple writing cycles to reduce positional error as the energy delivered in any single writing cycle to the substrate 16 is averaged with photonic energy delivered in other writing cycles.

Next, the alignment camera 38 may include an optical sensor, for example a charge coupling device, to read at least one alignment mark 46 on the substrate 16 to register the substrate 16 to the stage 40 and the SLM 12. The alignment camera 38 may be coupled to the computer processor 32 to facilitate the determination of the relative locations of the polygons of the pattern 15 upon the substrate 16. In this regard, once the substrate 16 may be registered via the alignment camera 38, the writing cycles may begin.

The stage 40 may support the substrate 16 and to move the substrate 16 relative to the SLM 12. The stage 40 may include at least one surface 31 to support the substrate 16 in the z-direction. The stage 40 may move in accordance to at least one motor 33 with the velocity $V_{XY}$ in the X-direction and/or the y-direction to move the substrate 16 relative to the SLM 12, so that the pattern 15 may fall within the optical pathways 24(1)-24(N) of the mirrors 28(1)-28(N) during the writing cycles. The stage 40 may also include at least one linear encoder (not shown) to provide positional information to the computer processor 32 regarding changes in the position of the stage 40 in the x-direction and/or y-direction.

Next, with continued reference to FIG. 1C, the optics 42 may include a reduction ratio to reduce the size of the optical beams 18(1)-18(N) upon the substrate 16. The reduction ratio may be in a range from 2:1 to 10:1. In this regard, the optics 44 may include at least one lens including at least one convex surface and/or concave surface between the substrate 16 and the SLM 12. The optics 44 may comprise a material of high transmissibility (for example: quartz) for various wavelengths of the light 34 to focus the optical beams 18(1)-18(N) upon the substrate 16. In one embodiment, when the mirrors 28(1)-28(N) are in the active position 30A, the effective pitch separating optical centers of adjacent optical beams 18(1)-18(N) from each other may be twenty-five (25) microns or less. Also, the mirrors 28(1)-28(N) may reflect the optical beams 18(1)-18(N) along the parallel or substantially parallel paths of the optical pathways 24(1)-24(N) toward the substrate 16. As the optical beams 18(1)-18(N) pass through the optics 44 towards the substrate 16, the effective pitch may be five (5) microns or less at the substrate 16 for a reduction ratio of 5:1 for the optics 44. In this manner, a higher resolution image may be created with more precise control upon the substrate 16 than without the optics 42.

Figure 1D:
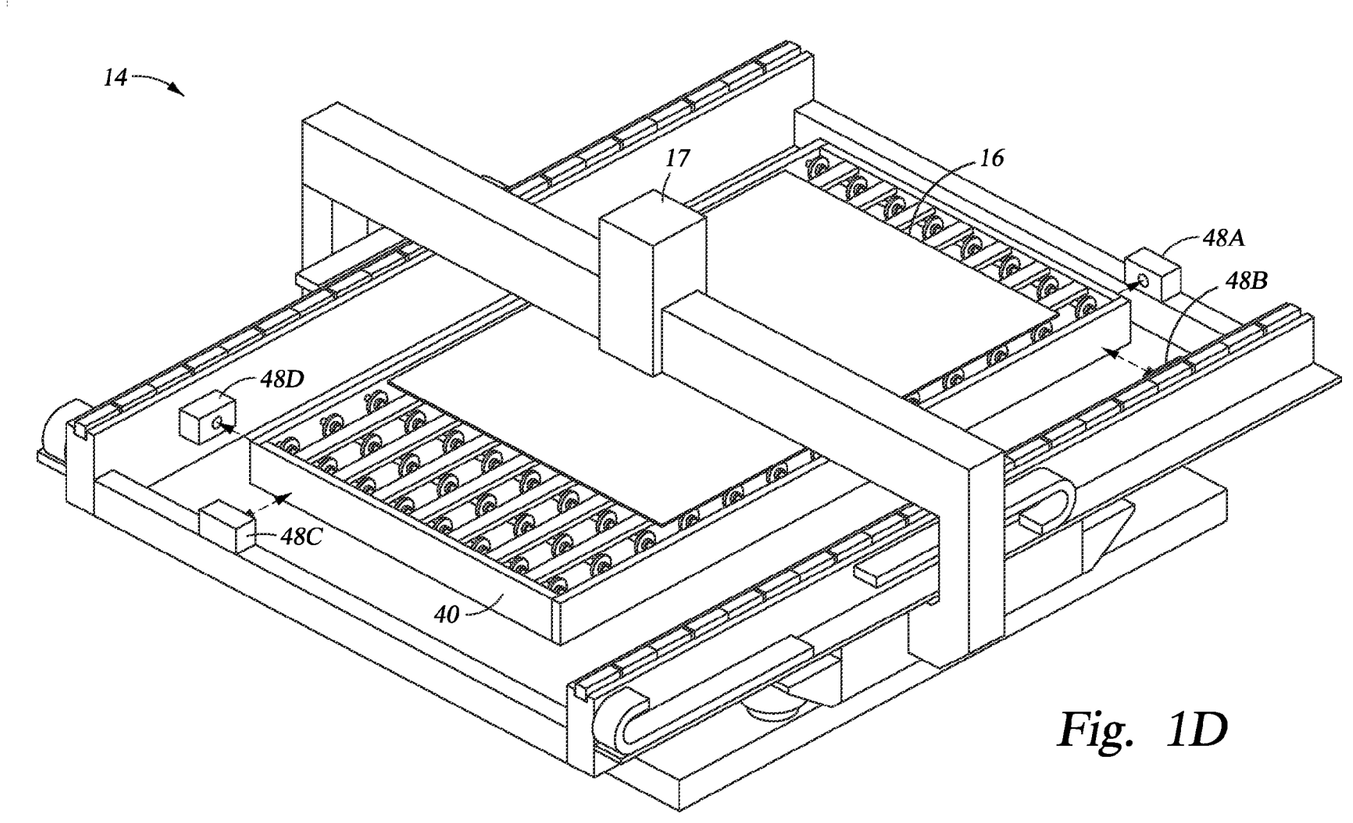
FIG. 1D is a top perspective view of an exemplary embodiment of the multi-beam pattern generator of FIG. 1C.

FIG. 1D is a top perspective view of an exemplary embodiment of the multi-beam pattern generator of FIG. 1C showing the writing mechanism 17 shown in FIG. 1C mounted relative to the stage 40. The writing mechanism 17 may include the optics 42, the light source 26A, 26B, the alignment camera 38, the computer processor 32, and the SLM 12. In this manner, the substrate 16 supported by the stage 40 may move relative to the writing mechanism 17 to write the pattern upon the substrate 16.

Figure 3:
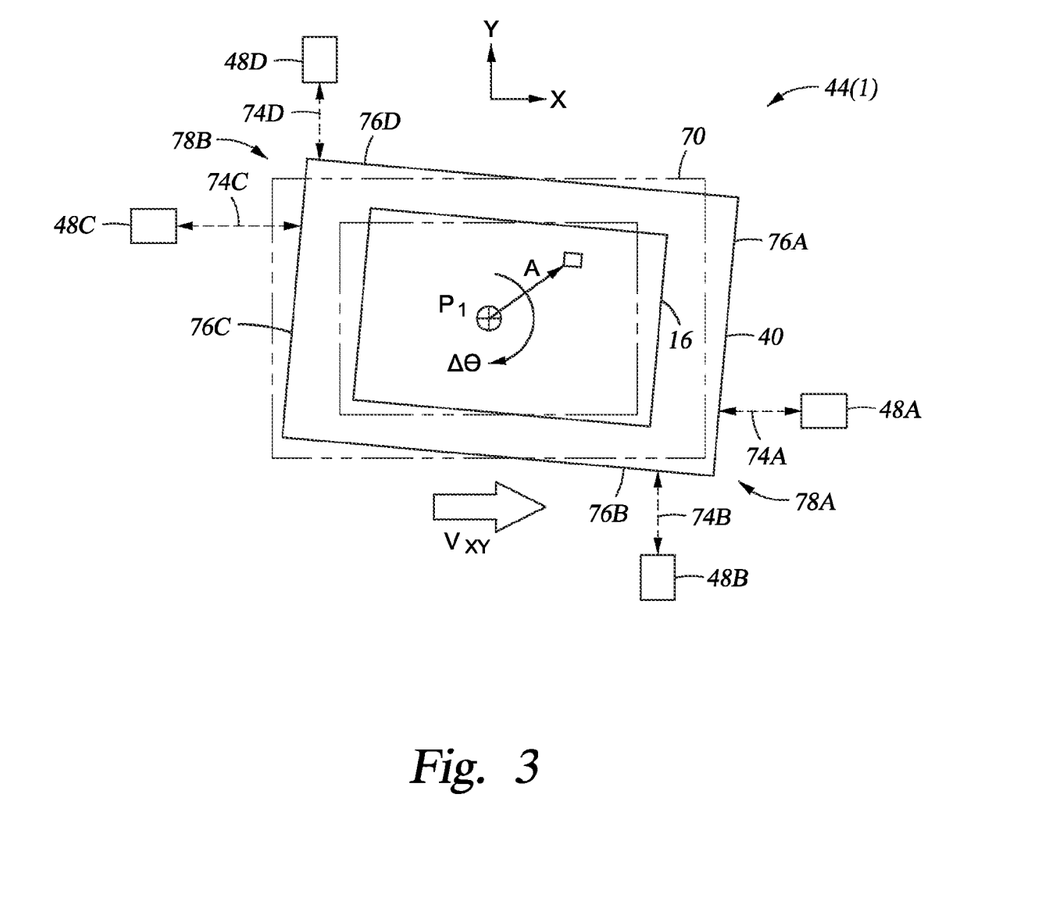
FIG. 3 is a partial top schematic view of the configuration of laser interferometers of FIGS. 1A-1C measuring positional changes in the stage supporting the substrate with the configuration of laser interferometers measuring position changes of corners on opposite sides of a diagonal of the rectangular-shaped substrate.

Next, FIG. 3 depicts a partial top schematic view of a yaw detection apparatus 44(1) comprising laser interferometers 48A-48D directly measuring a position and yaw of the stage 40 at the beginning of a writing cycle, wherein a previous position 70 of the stage 40 and a previous position 72 of the substrate 16 in the previous writing cycle are shown in broken lines. The stage 40 may be supporting the substrate 16 and may be considered to be stationary with respect to each other. The laser interferometers 48A-48D may be mounted in stationary locations and may reflect laser beams 74A-74D, respectively, against the stage 40 to directly measure a position of the stage 40, including yaw. In this regard, the interferometers 48A-48B may reflect against adjacent sides 76A, 76B of the stage 40 at a corner 78A of the stage 40 and interferometers 48C-48D may reflect at adjacent sides 76C, 76D of the stage 40 at a corner 78B of the stage 40. The corners 78A, 78B of the stage 40 may be opposite each other across a diagonal of the rectangular shape of the stage 40. Variances of calculations of the position and/or the yaw of the substrate 16 using different combinations of the interferometers 56A-56D may be resolved by the computer processor 32, for example, by averaging. In this manner, the position and the yaw of the substrate 16 may be determined for each writing cycle.

With reference back to FIG. 1C, the computer processor 32 may in one embodiment comprise a semiconductor device, memory, and a storage device. The computer processor 32 may receive the pattern data which defines the pattern 15 comprising the plurality of polygons 19. The format of the pattern data may be, for example, in a format such as GDSII or MEBES Mode 5 format. The computer processor 32 may receive the pattern data and determine the locations of the polygons 19 of the pattern data upon the substrate 16, and also the optical pathways 24(1)-24(N) available for the optical beams 18(1)-18(N) to propagate along to the substrate 16 when the respective mirrors 28(1)-28(N) of the SLM 12 are actuated to the active positions 30A. Once the computer processor 32 has determined the locations of the polygons 19 and the optical pathways 24(1)-24(N) of the optical beams 18(1)-18(N) upon the substrate 16, then the computer processor 32 may then determine which of the mirrors of the SLM 12 to actuate to the active position 30A (FIG. 2) to write the pattern 15 for the writing cycle based on a writing strategy rule which may be adjustable to the user of the pattern generator 14.

Various embodiments of the writing strategy rule may be used by computer processor 32 to determine whether mirrors of the SLM 12 may be activated to write upon the substrate 16 during a writing cycle. In one embodiment, the writing strategy rule may comprise actuating respective ones of the mirrors 28(1)-28(N) of the SLM 12 to the active position 30A when the respective ones of the optical pathways 24(1)-24(N) are positioned over a polygon 19 of the pattern 15 intended to be written by the optical beams 18(1)-18(N). In this manner, whether the mirrors 28(1)-28(N) of the SLM 12 are actuated to the active position 30A (FIG. 2) to write upon the substrate 16 during a writing cycle may be determined.

Figure 4:
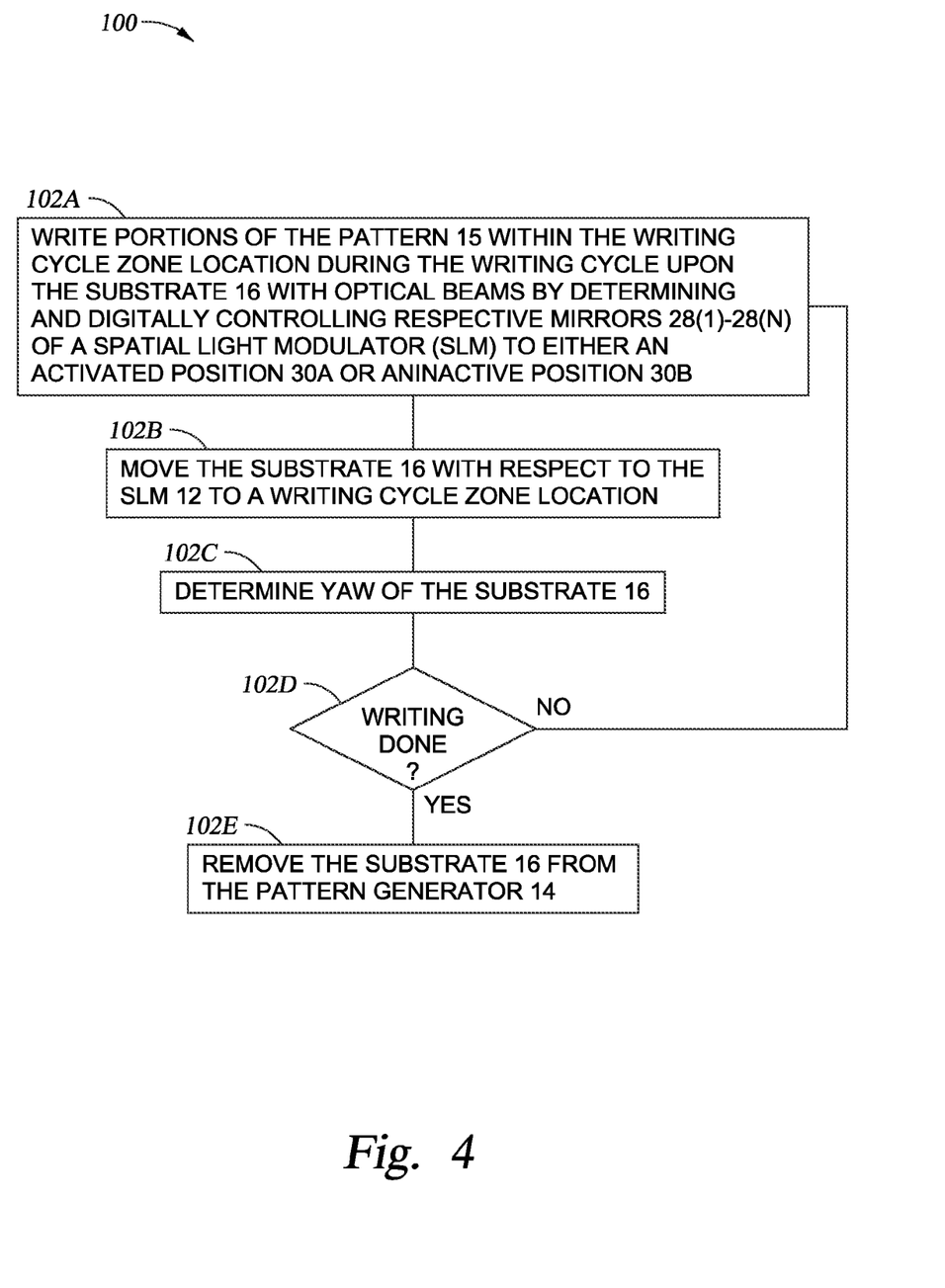
FIG. 4 is a flow chart diagram of an exemplary process of writing a pattern upon a substrate with the multi-beam pattern generator of FIGS. 1A-1C.

Now that the components of embodiments of the pattern generator 14 have been discussed, FIG. 4 depicts a flowchart diagram of an exemplary process 100 for writing the pattern 15 with the pattern generator 14 and actuating the optical beams 18(1)-18(N) on and off to compensate for the yaw of the substrate 16. The process 100 depicted in FIG. 4 will be described using the terminology and information provided above.

The process 100 may include writing portions of the pattern 15 within the writing cycle zone location WCZL during the writing cycles WC upon the substrate 16 with the optical beams 18(1)-18(N) of the light 34 by determining and digitally controlling respective ones of the mirrors 28(1)-28(N) of the SLM 12 to either the active position 30A or the inactive position 30B (operation 102A in FIG. 4). The process 100 may also include moving the substrate 16 with respect to the SLM 12 for each of the writing cycles (operation 102B in FIG. 4). The process 100 may also include measuring yaw of the substrate 16 for each of the writing cycles (operation 102C in FIG. 4). The digitally controlling selected ones of the mirrors 28(1)-28(N) includes compensating for the measured yaw of the substrate 16 each writing cycle. The yaw may be determined several times per writing cycle WC to provide a population of yaw error data for the computer processor 32 to average and discern high frequency yaw errors and stage position vibration errors from low frequency stage position vibrations. The low frequency stage position vibrations, for example, those below a threshold frequency in a range from a half (0.5) hertz to two-hundred (200) hertz, may be sent to the motor 33 (FIG. 1C) of the stage 40 for correction. In contrast, the high frequency yaw errors and stage position vibration errors above the threshold frequency may be assigned to the SLM 12 for correction by digitally controlling respective mirrors 28(1)-28(N) of the SLM 12.

The process 100 may also include determining whether the pattern 15 is fully written (operation 102D in FIG. 4). If the pattern 15 is not fully written then the writing may continue. Otherwise, if the pattern 15 is fully written, then the process 100 may include removing the substrate 16 from the pattern generator 14 (operation 102E in FIG. 4). In this manner, the pattern 15 may be written with improved pattern placement accuracy.

The components of the pattern generator 14 have been discussed as well as the method 100 for writing the pattern 15 with the pattern generator 14. Now other embodiments of a yaw detection apparatus 44(2)-44(3) are possible utilizing different configurations of laser interferometers to determine the yaw of the substrate 16 at each writing cycle.

Figure 5:
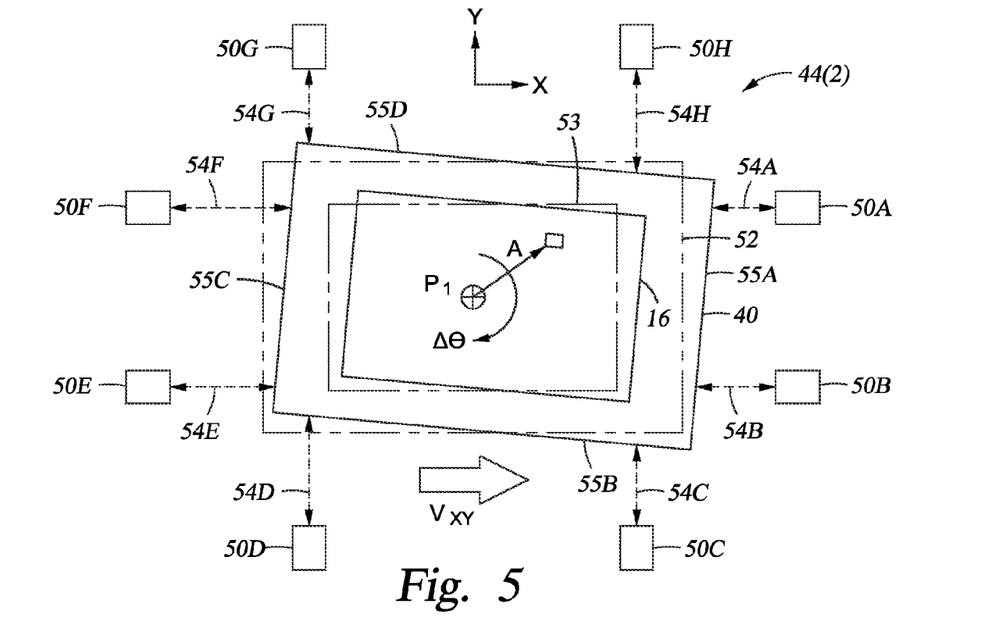
FIG. 5 is partial top schematic view of another embodiment of a configuration of laser interferometers compatible with the multi-beam pattern generator of FIGS. 1A-1C with at least two laser interferometers at each of the four sides of the stage having a rectangular shape measuring positional changes, including yaw, of the stage.

In this regard, FIG. 5 depicts a yaw detection apparatus 44(2) comprising laser interferometers 50A-50H measuring a position and yaw of the stage 40 at the beginning of a writing cycle, wherein a previous position 52 of the stage 40 and a previous position 53 of the substrate 16 in the previous writing cycle are shown in broken lines. The stage 40 may be supporting the substrate 16 and the stage 40 and the substrate 16 are considered to be stationary relative to each other. The laser interferometers 50A-50H may be mounted in stationary locations and may reflect laser beams 54A-54H, respectively, against the stage 40 to measure a position of the stage 40, including yaw. The interferometers 50A-50B may reflect at a side 55A of the stage 40, the interferometers 50C-50D may reflect at a side 55B of the stage 40, the interferometers 50E-50F may reflect at a side 55C of the stage 40, and the interferometers 50G-50H may reflect at a side 55D of the stage 40. Variances of calculations of the position and/or the yaw of the stage 40 using different combinations of the interferometers 50A-50H may be resolved by the computer processor 32, for example, by averaging. In this way, the position and yaw of the stage 40 and the substrate 16 supported thereon may be determined at each of the writing cycles, so a desired location of that the pattern 15 may be determined with respect to the substrate 16.

Figure 6:
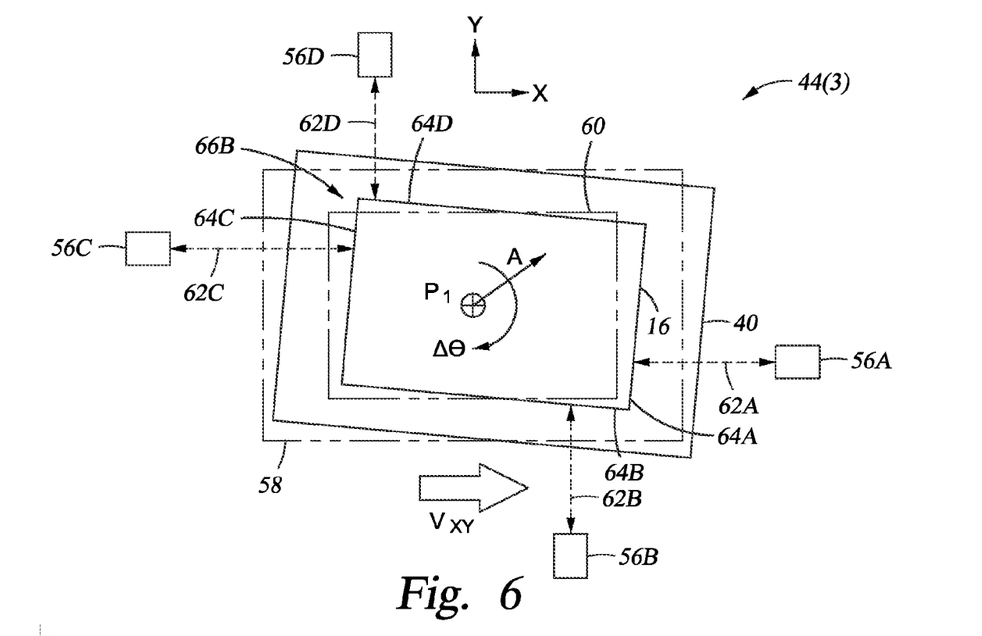
FIG. 6 is partial top schematic view of another embodiment of a configuration of laser interferometers directly measuring positional changes of the substrate, including yaw, and compatible with the pattern generator of FIGS. 1A-1C.

Another embodiment of the yaw detection apparatus is possible. FIG. 6 depicts a yaw detection apparatus 44(3) comprising laser interferometers 56A-56D directly measuring a position and yaw of the substrate 16 at the beginning of a writing cycle, wherein a previous position 58 of the stage 40 and a previous position 60 of the substrate 16 in the previous writing cycle are shown in broken lines. The stage 40 may support the substrate 16 and may move relative to each other. The laser interferometers 56A-56D may be mounted in stationary locations and may reflect laser beams 62A-62D, respectively, against the substrate 16 to directly measure a position of the substrate 16, including yaw. In this regard, the interferometers 56A-56B may reflect against adjacent sides 64A, 64B of the substrate 16 at a corner 66A of the substrate 16 and interferometers 56C-56D may reflect at adjacent sides 64C, 64D of the substrate 16 at a corner 66B of the substrate 16. The corners 66A, 66B of the substrate 16 may be opposite each other across a diagonal of the substrate 16 having a rectangular shape. Variances of calculations of the position and/or the yaw of the substrate 16 using different combinations of the interferometers 56A-56D may be resolved by the computer processor 32, for example, by averaging. In this manner, the position and the yaw of the substrate 16 may be determined directly for each of the writing cycles without error due to relative movement between the substrate 16 and the stage 40.

Many modifications and other embodiments not set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

While the foregoing is directed to embodiments of the present invention, other and further embodiments of the invention may be devised without departing from the basic scope thereof, and the scope thereof is determined by the claims that follow.

What is claimed is:

1. A pattern generator, comprising:
 a stage configured to support a substrate and move the substrate to different writing cycle zone positions with respect to a spatial light modulator (SLM) for each of a plurality of writing cycles;
 a light source configured to emit light;
 the SLM, wherein each mirror of the SLM is configured to be individually digitally controlled from an inactive position to an active position during the writing cycles to reflect a respective portion of the light to the substrate;
 a computer processor configured to
  receive pattern data comprising an arrangement of polygons of a pattern,
  identify whether the mirrors of the SLM are to be actuated to active positions during each of the writing cycles,
  determine yaw of the substrate, and
  compensate for yaw of the substrate in each of the writing cycles by digitally controlling respective mirrors of the SLM to active or inactive positions, and
 laser interferometers for determining corner positions of the substrate for every one of the writing cycles, wherein the computer processor is configured to determine yaw from the corner positions of the substrate.

2. The pattern generator of claim 1, wherein the computer processor is configured to identify whether mirrors of the SLM are to be actuated for a writing cycle after an immediately previous writing cycle has begun.

3. The pattern generator of claim 1, wherein the computer processor is configured to determine yaw for respective ones of the writing cycles based on a plurality of metrology measurements determined at a frequency higher than a speed of the writing cycle.

4. The pattern generator of claim 1, wherein the writing cycle zone positions for different ones of the writing cycles at least partially overlap.

5. The pattern generator of claim 1, wherein the computer processor is configured to actuate a respective mirror of the SLM to the active position during a writing cycle when the respective portion of the light of the respective mirror would be incident on the substrate within one or more desired polygons of the pattern as determined by the computer processor.

6. The pattern generator of claim 1, wherein the substrate comprises a rectangular-shaped surface for receiving the pattern, and the rectangular-shaped surface includes a length of at least 2.4 meters and a width of at least 2.1 meters.

7. The pattern generator of claim 1, wherein the pattern data is in graphic database system (GDS) format.

8. A pattern generator, comprising:
a stage configured to support a substrate and move the substrate to different writing cycle zone positions with respect to a spatial light modulator (SLM) for each of a plurality of writing cycles;
a light source configured to emit light;
the SLM, wherein each mirror of the SLM is configured to be individually digitally controlled from an inactive position to an active position during the writing cycles to reflect a respective portion of the light to the substrate; and
a computer processor configured to
receive pattern data comprising an arrangement of polygons of a pattern,
identify whether the mirrors of the SLM are to be actuated to active positions during each of the writing cycles,
determine yaw of the substrate,
categorize determined values of the yaw into a high frequency portion of the yaw and a low frequency portion of the yaw, wherein the high frequency yaw occurs with a frequency above a threshold frequency, and
compensate for yaw of the substrate in each of the writing cycles by digitally controlling respective mirrors of the SLM to active or inactive positions.

9. The pattern generator of claim 8, wherein the computer processor is configured to compensate for the low frequency portion of the yaw by instructing at least one motor of the stage to modify a movement of the stage, and the computer processor is configured to compensate for the high frequency portion of the yaw by digitally controlling respective mirrors of the SLM.

10. The pattern generator of claim 8, wherein the threshold frequency is in a range from a half (0.5) hertz to two-hundred (200) hertz.

11. The pattern generator of claim 10, wherein the writing cycles occur at speeds of at least five (5) kilohertz.

12. The pattern generator of claim 8, further comprising laser interferometers for determining corner positions of the stage for every one of the writing cycles, wherein the computer processor is configured to determine yaw from the corner positions of the stage.

13. A method of writing a pattern on a substrate with a multibeam pattern generator, comprising:
writing portions of the pattern within a writing cycle zone location on the substrate during writing cycles with optical beams of light by determining and digitally controlling respective ones of mirrors of a spatial light modulator (SLM) to either an active position or an inactive position;
moving the substrate with respect to the SLM to another writing cycle zone location for each of the writing cycles; and
determining yaw of the substrate for each of the writing cycles, wherein
determining the yaw comprises directly measuring corner positions of the substrate with at least one laser interferometer incident on each of four sides of the substrate, and
the digitally controlling respective ones of mirrors includes compensating for the determined yaw by controlling the mirrors to either the active or inactive positions.

14. The method of claim 13, wherein the digitally controlling comprises actuating the respective ones of the mirrors of the SLM to the active position during a writing cycle when optical pathways associated with the respective ones of the mirrors would be incident upon one or more desired polygons of the pattern on the substrate.

15. The method of claim 14, wherein the location of the one or more desired polygons on the substrate are determined based on the yaw.

16. A method of writing a pattern on a substrate with a multibeam pattern generator, comprising:
writing portions of the pattern within a writing cycle zone location on the substrate during writing cycles with optical beams of light by determining and digitally controlling respective ones of mirrors of a spatial light modulator (SLM) to either an active position or an inactive position;
moving the substrate with respect to the SLM to another writing cycle zone location for each of the writing cycles; and
determining yaw of the substrate for each of the writing cycles, wherein
the digitally controlling respective ones of mirrors includes compensating for the determined yaw by controlling the mirrors to either the active or inactive positions, and
the compensating for the determined yaw includes categorizing the determined yaw into a high frequency portion of the determined yaw and a low frequency portion of the determined yaw, wherein the high frequency determined yaw occurs with a frequency above a threshold frequency.

17. The method of claim 16, wherein determining the yaw comprises directly measuring with laser interferometers positions of a stage to determine the yaw of the substrate supported by the stage.

18. The method of claim 16, wherein the low frequency portion of the yaw is compensated for by instructing at least one motor of a stage to modify a movement of the stage, and the high frequency portion of the yaw is compensated for by digitally controlling respective mirrors of the SLM.

* * * * *